United States Patent
Koo et al.

(10) Patent No.: US 11,754,921 B2
(45) Date of Patent: Sep. 12, 2023

(54) CROSSLINKING AGENT COMPOUND, PHOTOSENSITIVE COMPOSITION COMPRISING THE SAME, AND PHOTOSENSITIVE MATERIAL USING THE SAME

(71) Applicant: LG CHEM, LTD., Seoul (KR)

(72) Inventors: Kichul Koo, Daejeon (KR); Seongku Kim, Daejeon (KR); Jung Ho Jo, Daejeon (KR); Hangah Park, Daejeon (KR); Soonho Kwon, Daejeon (KR); Hoonseo Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 443 days.

(21) Appl. No.: 16/958,046

(22) PCT Filed: Jul. 24, 2019

(86) PCT No.: PCT/KR2019/009191
§ 371 (c)(1),
(2) Date: Jun. 25, 2020

(87) PCT Pub. No.: WO2020/130261
PCT Pub. Date: Jun. 25, 2020

(65) Prior Publication Data
US 2021/0061976 A1    Mar. 4, 2021

(30) Foreign Application Priority Data

Dec. 21, 2018  (KR) .......................... 10-2018-0167760

(51) Int. Cl.
| | | |
|---|---|---|
| *C08K 5/544* | (2006.01) | |
| *G03F 7/038* | (2006.01) | |
| *C08K 5/5455* | (2006.01) | |
| *C08L 79/08* | (2006.01) | |
| *G03F 7/075* | (2006.01) | |

(52) U.S. Cl.
CPC .......... *G03F 7/0387* (2013.01); *C08K 5/5455* (2013.01); *C08L 79/08* (2013.01); *G03F 7/0755* (2013.01)

(58) Field of Classification Search
CPC ... G03F 7/0387; G03F 7/0755; C08K 5/5455; C08K 5/20; C08L 79/08; C08L 101/08; C08J 3/24; C07C 235/08; C07C 271/28; C07C 233/69; C07C 233/20; C07C 235/84; C07C 231/02; C07C 233/18; C07C 233/60; C07C 235/74; C07C 271/12; C07C 233/21; C07C 2601/14; C07C 2601/08; C07C 2601/16; C07C 2602/28; C07C 2602/42
See application file for complete search history.

(56) References Cited

U.S. PATENT DOCUMENTS

| | | | |
|---|---|---|---|
| 2005/0042536 A1 | 2/2005 | Cho et al. | |
| 2005/0267276 A1 | 12/2005 | Chu | |
| 2006/0131267 A1 | 6/2006 | Lee et al. | |
| 2010/0233622 A1 | 9/2010 | Lee et al. | |
| 2014/0316060 A1* | 10/2014 | Madsen ............... | C09D 11/101 528/73 |
| 2016/0109759 A1 | 4/2016 | Kang et al. | |
| 2017/0017155 A1 | 1/2017 | Tsutsumi | |
| 2017/0038681 A1 | 2/2017 | Shindo | |
| 2018/0031970 A1 | 2/2018 | Arimoto et al. | |
| 2021/0139780 A1 | 5/2021 | Kwon et al. | |

FOREIGN PATENT DOCUMENTS

| | | |
|---|---|---|
| CN | 101291941 A | 10/2008 |
| CN | 101479664 A | 7/2009 |
| CN | 105745253 A | 7/2016 |
| CN | 106062631 A | 10/2016 |
| CN | 106164773 A | 11/2016 |
| JP | S57-041636 A | 3/1982 |
| JP | 2005-506579 A | 3/2005 |
| JP | 2010-212656 A | 9/2010 |
| JP | 2016-218149 A | 12/2016 |
| JP | 2018-133420 A1 | 8/2018 |
| JP | 2020-507808 A | 3/2020 |
| KR | 10-2003-0033720 A | 5/2003 |
| KR | 10-2010-0102451 A | 9/2010 |
| KR | 10-2013-0109018 A | 10/2013 |
| KR | 10-2014-0024285 A | 2/2014 |
| KR | 10-1574835 B1 | 12/2015 |
| KR | 10-2016-0047030 A | 5/2016 |
| KR | 10-2018-0127892 A | 11/2018 |
| KR | 10-1932449 B1 | 12/2018 |
| TW | I320514 B | 2/2010 |
| TW | I391783 B | 4/2013 |
| TW | I545106 B | 8/2016 |

(Continued)

OTHER PUBLICATIONS

English translation of WO 2012/121179 A1; Naohiro Hamada; Published: Sep. 13, 2012 (Year: 2012).*
Chemical Abstract chemical, STN express, RN 81020-07-7 (Entered STN: Nov. 16, 1984).
International Search Report issued for PCT/KR2019/009191 dated Nov. 11, 2019, 3 pages.
Extended European Search Report dated Mar. 12, 2021, of the corresponding European Patent Application No. 19886051.2, 7 pages.

(Continued)

*Primary Examiner* — Mark F. Huff
*Assistant Examiner* — Richard David Champion
(74) *Attorney, Agent, or Firm* — ROTHWELL, FIGG, ERNST & MANBECK, P.C.

(57) ABSTRACT

The present invention relates to a crosslinking agent compound in which a terminal crosslinkable functional group is capped with a silane-based protecting group, a photosensitive composition including the same, and a photosensitive material using the same.

15 Claims, No Drawings

(56) References Cited

FOREIGN PATENT DOCUMENTS

| TW | 201641537 A | 12/2016 | | |
|---|---|---|---|---|
| WO | 2012-121179 A1 | 9/2012 | | |
| WO | WO-2012121179 A1 * | 9/2012 | ........... | C07C 231/02 |
| WO | 2016-140024 A | 9/2016 | | |
| WO | 2018-092811 A | 5/2018 | | |

OTHER PUBLICATIONS

Ruzié et al, "Tailoring a Bacteriochlorin Building Block with Cationic, Amphipathic, or Lipophilic Substituents", Journal of Organic Chemistry, vol. 73, No. 15, Aug. 1, 2008, pp. 5806-5820.

* cited by examiner

CROSSLINKING AGENT COMPOUND, PHOTOSENSITIVE COMPOSITION COMPRISING THE SAME, AND PHOTOSENSITIVE MATERIAL USING THE SAME

CROSS-REFERENCE TO RELATED APPLICATION(S)

This application is a 35 U.S.C. 371 National Phase Entry Application from PCT/KR2019/009191 filed on Jul. 24, 2019, designating the United States, which claims the benefit of the filing date of Korean Patent Application No. 10-2018-0167760 filed on Dec. 21, 2018, the entire contents of which are incorporated herein by reference.

TECHNICAL FIELD

The present invention relates to a crosslinking agent compound having excellent crosslinkability and improved solubility in solvents, a photosensitive composition capable of realizing excellent mechanical strength and storage stability during the synthesis of a photosensitive material, and a photosensitive material using the same.

BACKGROUND OF THE INVENTION

A photosensitive resin is a representative functional polymer material that has been put into practical use in the production of various precision electronics and information industry products, and is currently used importantly in the advanced technology industry, especially in the production of semiconductors and displays.

In general, the photosensitive resin refers to a polymer compound in which chemical changes occur in molecular structure in a short time by light irradiation, resulting in changes of physical properties such as solubility in a specific solvent, coloring, and curing. Using the photosensitive resin allows fine precision processing, can greatly reduce energy and raw materials compared to a thermal reaction process, and can perform work quickly and accurately in a small installation space. Thus, the photosensitive resin is variously used in precision electronics and information industries such as advanced printing, semiconductor production, display production, and photocuring surface coating materials.

Meanwhile, recently, as electronic devices have been highly integrated and micropatterned, there is a need to provide photosensitive resins capable of minimizing a defect rate and increasing processing efficiency and resolution. Accordingly, a method of using polyamide acid, polyamic acid, or the like as the photosensitive resin has been introduced.

However, the polyamide acid is easily hydrolyzed by water or the like in the air, so that the storage property and stability are not sufficient, while polyamic acid has low adhesion to a substrate to be applied to, and there is a problem in that the physical properties of the electrical wiring or the substrate are lowered upon application at a high temperature. In particular, the photosensitive resin has a problem that the mechanical properties in a finally cured state are not sufficient.

Therefore, in order to produce a photosensitive material having high mechanical properties required in the display field, a method of adding various crosslinking agents to the photosensitive composition has been proposed. However, the solubility of the crosslinking agent compound is not sufficient, and thus the stability and dispersibility are decreased. Further, there is a limit that it is difficult for the photosensitive composition to have uniformity, thereby decreasing reliability.

Thus, there is a need to develop a crosslinking agent compound that can have improved solubility and can have excellent storage stability and dispersibility within the composition, while being excellent in crosslinkability and thus being able to implement excellent mechanical properties.

BRIEF DESCRIPTION OF THE INVENTION

The present invention provides a crosslinking agent compound having excellent crosslinkability and improved solubility in solvents.

The present invention also provides a photosensitive composition capable of realizing excellent mechanical strength and storage stability during the synthesis of a photosensitive material.

The present invention further provides a photosensitive material using the above-mentioned photosensitive composition.

In an aspect of the invention, a crosslinking agent compound represented by the following Chemical Formula 1 is provided:

[Chemical Formula 1]

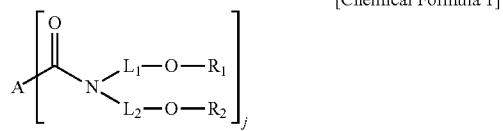

wherein, in Chemical Formula 1, A is a monovalent to tetravalent aromatic functional group, j is an integer of 1 to 4, $L_1$ and $L_2$ are each independently an alkylene group having 1 to 10 carbon atoms or an arylene group having 6 to 20 carbon atoms, and $R_1$ and $R_2$ are each independently a silicon-containing monovalent functional group.

In another aspect of the invention, a photosensitive composition including a rove mentioned crosslinking agent compound is provided.

In yet another aspect of the invention, a photosensitive composition including the above-mentioned crosslinking agent compound and a polymer containing one or more carboxyl groups is provided.

In the other aspect of the invention, a photosensitive material including a cured product of the above-mentioned photosensitive composition is provided.

DETAILED DESCRIPTION OF THE INVENTION

Hereinafter, a crosslinking agent compound according to specific embodiments of the present invention, a photosensitive composition including the same, and a photosensitive material using the same will be described in more detail.

Unless defined otherwise herein, the following terms may be defined as follows.

In the present specification, a description of a certain part "including" or "comprising" certain constituents means being capable of further including other constituents, and does not exclude the presence or addition of other constituents unless particularly stated to the contrary.

In the present specification, the term "substituted" means that other functional groups instead of a hydrogen atom in the compound are bonded, and a position to be substituted is not limited as long as it is a position at which the hydrogen atom is substituted, that is, a position at which it is substitutable with the substituent. When two or more substituents are substituted, the two or more substituents may be the same as or different from each other.

As used herein, the term "substituted or unsubstituted" means being unsubstituted or substituted with one or more substituents selected from the group consisting of deuterium; a halogen group; a cyano group; a nitro group; a hydroxy group; a carbonyl group; an ester group; an imide group; an amide group; an amino group; a carboxy group; a sulfonic acid group; a sulfonamide group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an arylphosphine group; or a heterocyclic group containing at least one of N, O, and S atoms, or being unsubstituted or substituted with a substituent to which two or more substituents are linked among the substituents exemplified above. For example, "the substituent to which two or more substituents are linked" may be a biphenyl group. That is, the biphenyl group may also be an aryl group, and may be interpreted as a substituent to which two phenyl groups are linked.

In the present specification, the (co)polymer means including both a polymer and a copolymer, the polymer means a homopolymer consisting of a single repeating unit, and the copolymer means a composite polymer containing two or more repeating units.

In the present specification, the (co)polymer means including a random (co)polymer, a block (co)polymer, a graft (co)polymer, and the like.

In the present specification, the notation ╪ or ─* means a bond linked to another substituent group, and a direct bond means the case where no other atoms exist in the parts represented as L.

In the present specification, an alkyl group may be a straight-chain or a branched-chain group, and the number of carbon atoms thereof is not particularly limited, but is preferably 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, an alkylene group is a bivalent functional group derived from an alkane, and the number of carbon atoms thereof is 1 to 20, or 1 to 10, or 1 to 5. For example, the alkylene group is straight-chain, branched-chain, or cyclic group, and may include a methylene group, an ethylene group, a propylene group, an isobutylene group, a sec-butylene group, a tert-butylene group, a pentylene group, a hexylene group, or the like. One or more hydrogen atoms contained in the alkylene group may be substituted with the same substituents as in the alkyl group.

In the present specification, an aryl group is a monovalent functional group derived from an arene, and the number of carbon atoms thereof is not particularly limited, but is preferably 6 to 20. The aryl group may be a monocyclic aryl group or a polycyclic aryl group. The aryl group may be a phenyl group, a biphenyl group, a terphenyl group, or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group a fluorenyl group, and the like, but are not limited thereto. The aryl group may be substituted or unsubstituted.

In the present specification, an arylene group is a divalent functional group derived from an arene and may be monocyclic or polycyclic, and the number of carbon atoms thereof is 6 to 20 or 6 to 10. For example, the arylene group may be a phenylene group, a biphenylene group, a terphenylene group, a stilbenylene group, a naphthylenyl group, and the like, but is not limited thereto. One or more hydrogen atoms contained in the arylene group may be substituted with the same substituents as in the alkyl group.

In the present specification, a multivalent functional group is a residue in which a plurality of hydrogen atoms bonding to an arbitrary compound are removed, and for example, it may be a divalent functional group, a trivalent functional group, or a tetravalent functional group. As an example, a tetravalent functional group derived from a cyclobutane means a residue in which any four hydrogen atoms bonded to the cyclobutane are removed.

In the present specification, a direct bond or a single bond means being connected to a bond line in which no atoms or atomic groups exist at the corresponding position. Specifically, it means the case where no other atoms exist in the parts represented as $R_a$ or $L_b$ (where a and b are each an integer of 1 to 20) in Chemical Formula.

In the present specification, the weight average molecular weight means a weight average molecular weight in terms of polystyrene measured by a GPC method. In the process of determining the weight average molecular weight in terms of polystyrene measured by the GPC method, a commonly known analyzing device, a detector such as a refractive index detector, and an analytical column can be used. Commonly applied conditions for temperature, solvent, and flow rate can be used. Specific examples of the measurement condition are as follows: a Waters PL-GPC220 instrument with Polymer Laboratories PLgel MLX-B, 300 mm column, was used, the evaluation temperature was 160° C., 1,2,4-trichlorobenzene was used as a solvent, the flow rate was 1 mL/min, samples were prepared at a concentration of 10 mg/10 mL and then fed in an amount of 200 μL, and the values of Mw could be determined using a calibration curve formed using a polystyrene standard. The molecular weight of the polystyrene standards used herein was 9 types of 2000/10,000/30,000/70,000/200,000/700,000/2,000,000/4, 000,000/10,000,000.

The present inventors found through experiments that when the crosslinking agent compound according to the present invention has a structure in which the terminal of the hydroxy group (—OH), which is a crosslinkable functional group, is substituted with specific functional groups of $R_1$ and $R_2$ as shown in Chemical Formula 1, the functional groups of $R_1$ and $R_2$ act as protective groups, so that the solubility and dispersibility of the crosslinking agent compound are increased, and the crosslinking agent compound is uniformly dispersed in the composition to which the crosslinking agent compound is added, thereby having excellent crosslinking effects. The present invention has been completed on the basis of these findings.

In addition, the present inventors found that when the terminal of the hydroxyl group (—OH), which is a crosslinkable functional group, is substituted with the silicon-containing functional groups of $R_1$ and $R_2$, the crosslinking agent compound contains silicon-containing functional groups, and therefore the reactivity of the crosslinking agent in the initial drying step is reduced compared to the existing crosslinking agent having a hydroxyl group (—OH) at the terminal, and the crosslinking reaction is started after heat treatment to reduce the deterioration of initial physical properties due to the crosslinking agent.

The functional groups of $R_1$ and $R_2$ introduced to the terminal of the crosslinkable functional group of the crosslinking agent compound can inhibit the crosslinking reaction by the crosslinkable functional groups in the photosensitive composition, thereby minimizing the formation of unnecessary crosslinking structures and improving stability and reliability of the composition. Further, as these functional groups are detached and removed at a temperature of about 80° C. or higher by heat treatment during the synthesis of the photosensitive material, the hydroxyl group at the terminal of the crosslinkable functional group is restored, thereby enabling a crosslinking reaction to smoothly proceed and improving mechanical properties of the photosensitive material.

That is, in the photosensitive composition, the structure of the crosslinking agent compound represented by Chemical Formula 1 may be maintained, so that the crosslinking reaction may be inhibited between the polymer containing one or more carboxyl groups and the crosslinking agent compound represented by Chemical Formula 1. Moreover, when the temperature rises due to heat treatment through a drying step, an exposure step, a curing step, etc., for producing a photosensitive material from the photosensitive composition, the functional groups of $R_1$ and $R_2$ in the crosslinking agent compound represented by Chemical Formula 1 are substituted with hydrogen atoms, and thus the crosslinking reaction can be proceeded between a polymer containing one or more carboxyl groups and a crosslinking agent compound represented by Chemical Formula 6 described hereinafter.

Therefore, the photosensitive composition of one embodiment can inhibit the crosslinking reactivity of the crosslinking agent compound added to the composition, and thus sufficiently improve the dispersibility of the crosslinking agent compound and the polymer containing one or more carboxyl groups. In addition, it is possible to realize the effect of improving the strength of the photosensitive material through the crosslinking reaction between the crosslinking agent compound and the polymer containing one or more carboxyl groups in the composition during the production process of the photosensitive material of another embodiment described hereinafter.

1. Crosslinking Agent Compound

The crosslinking agent compound according to the present invention may have a specific chemical structure represented by Chemical Formula 1. The physical/chemical properties of the crosslinking agent compound appear to be due to the specific structure of Chemical Formula 1 above.

In Chemical Formula 1, A is a monovalent to tetravalent aromatic functional group, and j may be an integer of 1 to 4. The A is an aromatic functional group located at the center of the crosslinking agent compound, and functional groups represented by curly brace "[ ]" in Chemical Formula 1 can be bonded by the number of j to the terminal functional group contained in A.

That is, in Chemical Formula 1, when j is 1, A is a monovalent functional group. Also, when j is 2, A is a divalent functional group. In addition, when j is 3, A is a trivalent functional group. Further, when j is 4, A is a tetravalent functional group.

Preferably, in Chemical Formula 1, A is an arylene group having 6 to 30 carbon atoms, and j may be 2.

When the functional group located at the center of the crosslinking agent compound represented by A is an aromatic functional group, similar to the crosslinking agent compound represented by Chemical Formula 1, the heat resistance and dimensional stability can be improved as compared to the crosslinking agent compound in which the aliphatic functional group is located at the center. This is because the intermolecular attraction and rigidity increase due to the inclusion of aromatic functional groups.

More specifically, in Chemical Formula 1, A is a divalent aromatic functional group represented by the following Chemical Formula 2, and j may be 2.

[Chemical Formula 2]

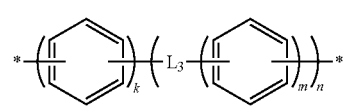

In Chemical Formula 2, $L_3$ is a single bond, —O—, —CO—, —S—, —$SO_2$—, —$C(CH_3)_2$—, —$C(CF_3)_2$—, —COO—, —$(CH_2)_z$—, —$O(CH_2)_zO$—, —$O(CH_2)_z$—, —$OCH_2$—$C(CH_3)_2$—$CH_2O$—, —COO—$(CH_2)_z$—OCO—, or —OCO—$(CH_2)_z$—COO—, each z is independently an integer of 1 to 10, k is an integer of 1 to 3, and n and m are each independently an integer of 0 to 3.

In Chemical Formula 1, $L_1$ and $L_2$ are each independently an alkylene group having 1 to 10 carbon atoms or an arylene group having 6 to 20 carbon atoms. Preferably, $L_1$ and $L_2$ may be each independently an alkylene group having 1 to 5 carbon atoms, for example, an ethylene group.

In Chemical Formula 1, $R_1$ and $R_2$ are functional groups substituted for a hydrogen atom at the terminal of the hydroxy group (—OH) which is a crosslinkable functional group of the crosslinking agent compound, and can inhibit the crosslinking reaction between the polymer containing one or more carboxyl groups and the crosslinking agent compound represented by Chemical Formula 1.

As described below, the functional groups of $R_1$ and $R_2$ undergo a drying step, an exposure step, a curing step, etc. for producing a photosensitive material from the photosensitive composition, and may be detached while being replaced with a hydrogen atom when raised to a temperature of about 80° C. or higher.

The $R_1$ and $R_2$ may each independently be a silicon-containing monovalent functional group.

Specifically, the silicon-containing monovalent functional group may be a functional group represented by the following Chemical Formula 3.

[Chemical Formula 3]

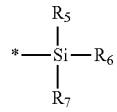

In Chemical Formula 3, $R_5$ to $R_7$ may each independently be hydrogen or an alkyl group having 1 to 10 carbon atoms.

More specifically, in Chemical Formula 3, $R_5$ to $R_7$ may be an alkyl having 1 to 10 carbon atoms, preferably a methyl group or an ethyl group.

In Chemical Formula 1, A is a divalent aromatic functional group, and n may be 2. That is, the crosslinking agent compound represented by Chemical Formula 1 may include a compound represented by the following Chemical Formula 1-1.

[Chemical Formula 1-1]

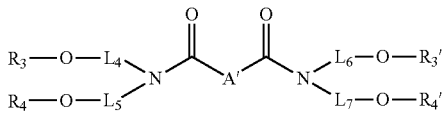

In Chemical Formula 1-1, A' is a divalent aromatic functional group, $L_4$ to $L_7$ are each independently an alkylene group having 1 to 10 carbon atoms or an arylene group having 6 to 20 carbon atoms, and $R_3$, $R_3'$, $R_4$, and $R_4'$ are each independently silicon-containing monovalent functional groups.

Specifically, in Chemical Formula 1-1, A' may be an arylene group having 6 to 30 carbon atoms, and more specifically, a divalent aromatic functional group represented by Chemical Formula 2.

Further, in Chemical Formula 1-1, $L_4$ to $L_7$ are each independently an alkylene group having 1 to 10 carbon atoms or an arylene group having 6 to 20 carbon atoms, and $R_3$, $R_3'$, $R_4$, and $R_4'$ may each independently be silicon-containing monovalent functional groups.

More specifically, an example of the crosslinking agent compound represented by Chemical Formula 1-1 may be a compound represented by the following Chemical Formula 1-2 in which A' is a divalent aromatic functional group represented by Chemical Formula 2, $L_4$ to $L_7$ are all ethylene groups having 2 carbon atoms, and $R_3$ to $R_6$ are all functional groups represented by Chemical Formula 3 ($R_3$, $R_3'$, $R_4$, and $R_4'$ are methyl groups).

tional groups represented by Chemical Formula 3 ($R_3$, $R_3'$, $R_4$, and $R_4'$ are ethyl groups).

[Chemical Formula 1-3]

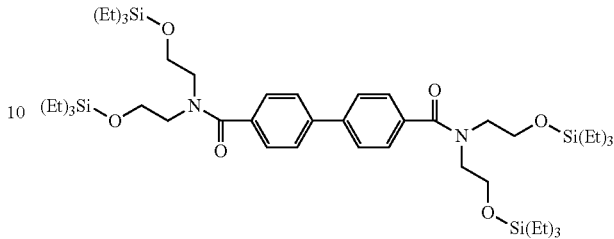

Meanwhile, the crosslinking agent compound represented by Chemical Formula 1 has excellent solubility in a solvent, and the solution mixed for 10 seconds after adding the crosslinking agent compound to the solvent may be transparent.

The mixed solution is a mixture of the crosslinking agent compound represented by Chemical Formula 1 and a solvent. Examples of the solvent are not particularly limited, and the solvent contained in the photosensitive composition may be, for example, N,N-dimethylformamide, N,N-dimethylacetamide, N-methyl-2-pyrrolidone, N-methylcaprolactam, 2-pyrrolidone, N-ethylpyrrolidone, N-vinylpyrrolidone, dimethyl sulfoxide, tetramethylurea, pyridine, dimethyl sulfone, hexamethyl sulfoxide, γ-butyrolactone, 3-methoxy-N,N-dimethylpropanamide, 3-ethoxy-N,N-dimethylpropanamide, 3-butoxy-N,N-dimethylpropanamide, 1,3-dimethyl-imidazolidinone, ethyl amyl ketone, methyl nonyl ketone, methyl ethyl ketone, methyl isoamyl ketone, methyl isopropyl ketone, cyclohexanone, ethylene carbonate, propylene carbonate, diglyme, 4-hydroxy-4-methyl-2-pentanone, ethylene glycol monomethyl ether, ethylene glycol monomethyl ether acetate, ethylene glycol monoethyl ether, ethylene glycol monoethyl ether acetate, ethylene glycol monopropyl ether, ethylene glycol monopropyl ether acetate, ethylene glycol monoisopropyl ether, ethylene glycol monoisopropyl ether acetate, ethylene glycol monobutyl ether, ethylene glycol monobutyl ether acetate, and the like.

[Chemical Formula 1-2]

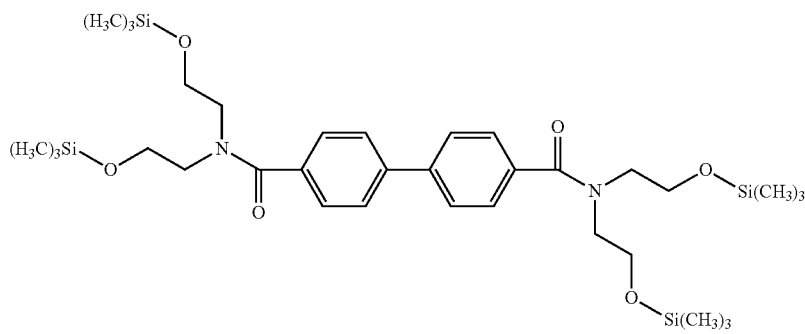

In addition, another example of the crosslinking agent compound represented by Chemical Formula 1-1 may be a compound represented by following Chemical Formula 1-3 in which A' is a divalent aromatic functional group represented by Chemical Formula 2, $L_4$ to $L_7$ are all ethylene groups having 2 carbon atoms, and $R_3$ to $R_6$ are all func- These solvents can be used alone or in combination as a mixture.

In the mixed solution, the crosslinking agent compound represented by Chemical Formula 1 may be 1 wt % to 30 wt %, 2 wt % to 25 wt %, 10 wt % to 25 wt %, or more than 10 wt % and 25 wt % or less based on the total weight of the mixed solution.

Meanwhile, according to one embodiment of the invention, the crosslinking agent compound represented by Chemical Formula 1 may be used for a photosensitive material.

Specifically, the crosslinking agent compound represented by Chemical Formula 1 can be used for manufacturing a photoresist sheet, an alignment film, an adhesive, an insulating layer, a color filter of a display device, a black matrix of a display device, a column spacer of a display device, photocurable paints, photocurable ink, and the like.

As described above, the crosslinking agent compound represented by Chemical Formula 1 has excellent solubility, and when the functional group introduced to the terminal is heat-treated at a temperature of 80° C. or higher, it is detached and removed and the hydroxyl group at the terminal of the crosslinkable functional group can be restored, thereby enabling a crosslinking reaction to smoothly proceed. Such characteristics of the crosslinking agent compound of the present invention can be implemented by having a specific structure represented by Chemical Formula 1.

Due to the characteristics as described above, when the crosslinking agent compound represented by Chemical Formula 1 is used for the photosensitive material, the crosslinking agent compound may be uniformly dispersed in the photosensitive composition, thereby uniformizing the physical properties of the photosensitive material produced therefrom.

Further, in the process of producing the photosensitive material, the crosslinking reactivity is inhibited at room temperature to sufficiently improve the dispersibility of the crosslinking agent compound and the polymer containing one or more carboxyl groups, and at the same time, as the temperature rises to 80° C. or higher through a drying step, an exposure step, a curing step, etc. for preparing a photosensitive material, the hydroxyl group at the terminal of the crosslinkable functional group is restored and the crosslinking reaction between polymers containing one or more carboxyl groups proceeds, thereby realizing a photosensitive material having improved mechanical strength.

Conventional crosslinking agent compounds have technical limitations, for example, the solubility is poor, the stability and dispersibility of the crosslinking agent are decreased, and the photosensitive composition is not uniform, so the reliability is reduced. However, in the case of the crosslinking agent compound of Chemical Formula 1 provided according to the present invention, not only is the solubility excellent, but also the functional group introduced to the terminal protects the crosslinkable hydroxy group, and thereby, it can have excellent storage stability and solubility as well as excellent mechanical strength.

2. Photosensitive Composition

Meanwhile, according to another embodiment of the invention, there a photosensitive composition including the crosslinking agent compound represented by Chemical Formula 1 can be provided.

According to yet another embodiment of the invention, a photosensitive composition including the crosslinking agent compound represented by Chemical Formula 1 and a polymer containing one or more carboxyl groups can be provided.

The polymer containing one or more carboxyl groups is not particularly limited, but may be, for example, a polymer such as polyamic acid.

The crosslinking agent compound represented by Chemical Formula 1 may be contained in an amount of 1 wt % to 30 wt %, 2 wt % to 25 wt %, 10 wt % to 25 wt %, or more than 10 wt % and 25 wt % or less based on the total weight of the photosensitive composition.

When the content of the crosslinking agent compound is too large, the degree of crosslinking of the polymer containing one or more carboxyl groups is excessively increased, and thus the flexibility of the polymer can be reduced. In addition, the storage stability may be decreased due to an increase in the viscosity of the composition, and the applicability to the substrate can be lowered due to a decrease of the dispersibility of the crosslinking agent in the composition or a gelation reaction in the composition.

On the other hand, when the content of the crosslinking agent compound is too small, it may be difficult to sufficiently realize the effect of improving the mechanical strength due to an increase in the degree of crosslinking of the polymer containing one or more carboxyl groups.

When the crosslinking agent compound represented by Chemical Formula 1 is heat-treated at a temperature of a certain level or higher, specifically at 80° C. or higher, the functional groups of $R_1$ and $R_2$ are detached and removed, and the terminal of the crosslinking functional group of the hydroxyl group (OH group) may be restored to smoothly proceed a crosslinking reaction with the polymer containing one or more carboxyl groups.

However, a crosslinking agent compound in which two or more terminal crosslinking functional groups are exposed by replacing a part or all of the functional groups of $R_1$ and $R_2$ with hydrogen atoms under the conditions of normal temperature of less than 80° C. and atmospheric pressure may be partially included.

This is due to the polymer containing the one or more carboxyl groups contained in the photosensitive composition of one embodiment. Specifically, by including the polymer containing one or more carboxyl groups, the photosensitive composition exhibits acidic conditions in which the functional groups of $R_1$ and $R_2$ are easily detached, and therefore, a crosslinking agent compound in which two or more terminal crosslinking functional groups are exposed by replacing a part or all of the functional groups of $R_1$ and $R_2$ with hydrogen atoms may be partially included.

That is, the photosensitive composition according to one embodiment may further include a crosslinking agent compound in which at least two terminal crosslinking functional groups are exposed.

Specifically, the crosslinking agent compound in which at least two terminal crosslinking functional groups are exposed may be a crosslinking agent compound represented by the following Chemical Formula 4.

[Chemical Formula 4]

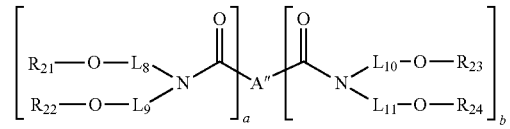

In Chemical Formula 4, A″ is a monovalent to tetravalent functional group, a is an integer of 1 to 4, b is an integer of 0 to 3, the sum of a and b is 1 to 4, $L_8$ to $L_{11}$ are each independently an alkylene group having 1 to 10 carbon atoms or an arylene group having 6 to 20 carbon atoms, at least one of $R_{21}$ and $R_{22}$ is hydrogen and the other is a silicon-containing monovalent functional group, and $R_{23}$ and $R_{24}$ are each independently a silicon-containing monovalent functional group.

More specifically, in Chemical Formula 4, when both $R_{21}$ and $R_{22}$ are hydrogen, a may be 1 to 4. In Chemical Formula 4, when one of $R_{23}$ and $R_{24}$ is hydrogen and the other is a silicon-containing monovalent functional group, a may be 2 to 4.

By including the crosslinking agent compound in which two or more terminal crosslinking functional groups are exposed, the photosensitive composition according to one embodiment may include a cross-linked product between the polymer containing one or more carboxyl groups and the crosslinking agent compound in which two or more terminal crosslinking functional groups are exposed.

Meanwhile, the photosensitive composition according to one embodiment may contain 0.001 parts by weight to 10 parts by weight, 0.1 parts by weight to 10 parts by weight, 0.1 parts by weight to 5 parts by weight, or 0.1 parts by weight to 3 parts by weight of the crosslinking agent compound represented by Chemical Formula 4 based on 100 parts by weight of the crosslinking agent compound represented by Chemical Formula 1.

When the photosensitive composition of one embodiment contains a crosslinking agent compound represented by Chemical Formula 4 so as to satisfy the above-described range, the crosslinking agent compound in which two or more terminal crosslinking functional groups are exposed, which may cause a crosslinking reaction with a polymer containing one or more carboxyl groups, is included in a small amount in the photosensitive composition, and thus, by improving the long-term storage stability and reliability, the physical properties of the photosensitive material produced from the photosensitive composition may be improved and also the effect of remarkably improving the efficiency of the film forming process may be realized.

On the other hand, when the photosensitive composition contains the crosslinking compound represented by Chemical Formula 4 so as to deviate from the above-described range, at the time of long-term storage, a crosslinking agent compound in which two or more terminal crosslinking functional groups are exposed is contained in a large amount in the photosensitive composition, and thus, a crosslinking reaction occurs between the polymer containing one or more carboxyl groups and the crosslinking agent compound in which two or more terminal crosslinking functional groups are exposed, and a large number of by-products are formed, resulting in a decrease in storage stability of the photosensitive material produced therefrom, which is not suitable for long-term storage.

Meanwhile, the photosensitive composition may further include a compound represented by the following Chemical Formula 5.

[Chemical formula 5]

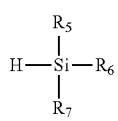

In Chemical Formula 5, $R_5$ to $R_7$ are as defined in Chemical Formula 3.

The compound represented by Chemical Formula 5 may be a result of the substitution reaction of the crosslinking agent compound represented by Chemical Formula 1.

Specifically, in the crosslinking agent compound represented by Chemical Formula 1, all or part of the functional groups of $R_1$ and $R_2$ can be detached by a substitution reaction, and thereby, the crosslinking agent compound in which two or more terminal crosslinkable functional groups are exposed and the compound represented by Chemical Formula 5 above can be formed.

Meanwhile, the polymer containing one or more carboxyl groups may include a polyamic acid (co)polymer.

Specifically, the polymer containing one or more carboxyl groups may include a first polyamic acid (co)polymer containing a repeating unit represented by the following Chemical Formula 6, and a second polyamic acid (co)polymer containing a repeating unit represented by the following Chemical Formula 7.

[Chemical Formula 6]

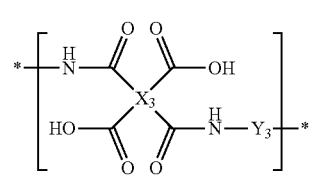

[Chemical Formula 7]

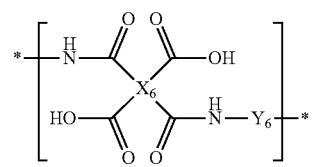

In Chemical Formulae 6, 7, $X_3$ and $X_6$ are each independently a tetravalent organic group represented by the following Chemical Formula 8.

[Chemical Formula 8]

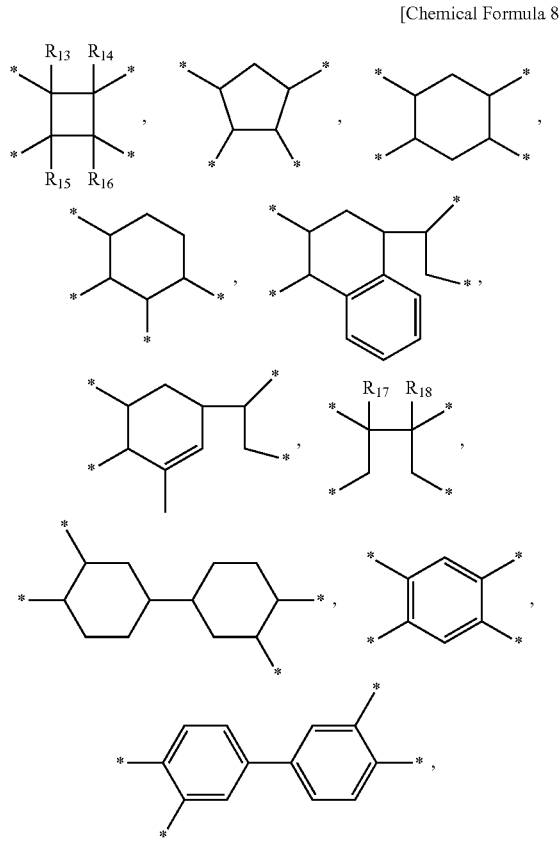

-continued

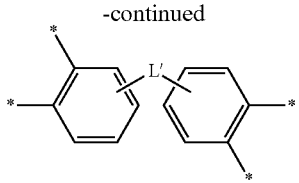

In Chemical Formula 8, $R_{13}$ to $R_{18}$ are each independently hydrogen or an alkyl group having 1 to 6 carbon atoms, is any one selected from a single bond —O—, —CO—, —COO—, —S—, —SO—, —SO$_2$—, —CR$_{19}$R$_{20}$—, —(CH$_2$)$_z$—, —O(CH$_2$)$_z$O—, —COO(CH$_2$)$_z$OCO—, —CONH—, or phenylene, $R_{19}$ and $R_{20}$ are each independently hydrogen, an alkyl group having 1 to 10 carbon atoms, and a haloalkyl group having 1 to 10 carbon atoms, z is an integer of 1 to 10, and $Y_3$ is a divalent organic group represented by the following Chemical Formula 9.

[Chemical Formula 9]

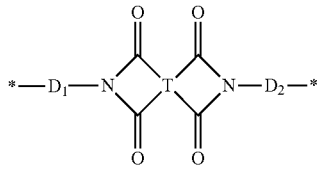

In Chemical Formula 9 T is a tetravalent organic group represented by Chemical Formula 8, $D_1$ and $D_2$ are each independently any one selected from an alkylene group having 1 to 20 carbon atoms, a hetero-alkylene group having 1 to 10 carbon atoms, a cycloalkylene group having 3 to 20 carbon atoms, an arylene group having 5 to 20 carbon atoms, and a heteroarylene group having 2 to 20 carbon atoms, and $Y_6$ is a divalent organic group represented by the following Chemical Formula 10.

[Chemical Formula 10]

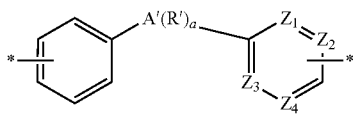

In Chemical Formula 10, A' is a group 15 element, R' is hydrogen or an alkyl having 1 to 10 carbon atoms, a is an integer of 1 to 3, and at least one of $Z_1$ to $Z_4$ is nitrogen and the rest are carbon.

In addition, in the polymer containing one or more carboxyl groups, the first polyamic acid (co)polymer containing a repeating unit represented by Chemical Formula 6 may further include one or more repeating units selected from the group consisting of a repeating unit represented by the following Chemical Formula 12 and a repeating unit represented by the following Chemical Formula 13.

[Chemical Formula 12]

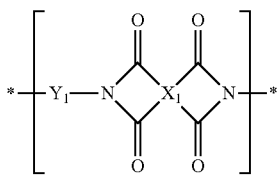

[Chemical Formula 13]

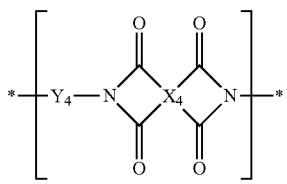

In Chemical Formulae 12 to 13, at least one of $R_9$ and $R_{10}$ is an alkyl group having 1 to 10 carbon atoms and the other is hydrogen, $X_1$ to $X_2$ are each independently a tetravalent organic group represented by Chemical Formula 8, and $Y_1$ to $Y_2$ are each independently a divalent organic group represented by Chemical Formula 9.

That is, the first polyamic acid (co)polymer may be a homopolymer composed of a single repeating unit represented by Chemical Formula 6, or may be a copolymer which is a composite polymer further including one or more repeating units selected from the group consisting of a repeating unit represented by Chemical Formula 12 and a repeating unit represented by Chemical Formula 13 in addition to the repeating unit represented by Chemical Formula 6.

In addition, in the polymer containing one or more carboxyl groups, the second polyamic acid (co)polymer containing a repeating unit represented by Chemical Formula 7 may further include one or more repeating units selected from the group consisting of a repeating unit represented by Chemical Formula 14 and a repeating unit represented by the following Chemical Formula 15.

[Chemical Formula 14]

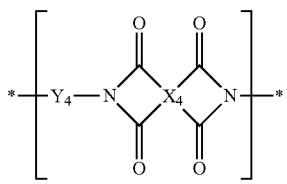

[Chemical Formula 15]

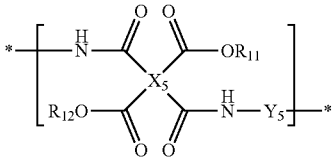

In Chemical Formulae 14 and 15, at least one of $R_{11}$ and $R_{12}$ is an alkyl group having 1 to 10 carbon atoms and the other is hydrogen, $X_4$ to $X_5$ are each independently a tetravalent organic group represented by Chemical Formula 8, and $Y_4$ to $Y_5$ are each independently a divalent organic group represented by Chemical Formula 10.

That is, the second polyamic acid (co)polymer may be a homopolymer composed of a single repeating unit represented by Chemical Formula 7, or may be a copolymer which is a composite polymer further including one or more repeating units selected from the group consisting of a repeating unit represented by Chemical Formula 14 and a repeating unit represented by Chemical Formula 15 in addition to the repeating unit represented by Chemical Formula 7.

Specifically, the first polyamic acid (co)polymer necessarily includes a repeating unit represented by Chemical Formula 6, and may further include one type of the repeating unit represented by Chemical Formula 12 and the repeating unit represented by Chemical Formula 13, or a combination of these two types.

Specifically, the second polyamic acid (co)polymer necessarily includes a repeating unit represented by Chemical Formula 7, and may further include one type of the repeating units represented by Chemical Formula 14 and the repeating unit represented by Chemical Formula 15, or a combination of these two types.

In the first polyamic acid (co)polymer and the second polyamic acid (co)polymer in the photosensitive composition according to one embodiment, $X_1$ to $X_6$ may each independently be a tetravalent organic group represented by Chemical Formula 8. The $X_1$ to $X_6$ may each be a functional group derived from a tetracarboxylic dianhydride compound used in the synthesis of polyamic acid, polyamic acid ester, or polyimide.

In Chemical Formula 8, $R_{13}$ to $R_{18}$ are each independently hydrogen or an alkyl group having 1 to 6 carbon atoms, L' is any one selected from a single bond, —O—, —CO—, —COO—, —S—, —SO—, —SO$_2$—, —CR$_{19}$R$_{20}$—, —(CH$_2$)$_z$—, —O(CH$_2$)$_z$O—, —COO(CH$_2$)$_z$OCO—, —CONH—, and phenylene, $R_{19}$ and $R_{20}$ in the L' are each independently hydrogen, an alkyl group having 1 to 10 carbon atoms, or a haloalkyl group having 1 to 10 carbon atoms, and z in the L' is an integer of 1 to 10.

More preferably, the $X_1$ to $X_6$ are each independently an organic group of the following Chemical Formula 8-1 derived from cyclobutane-1,2,3,4-tetracarboxylic dianhydride, an organic group represented by the following Chemical Formula 8-2 derived from 1,3-dimethylcyclobutane-1,2,3,4-tetracarboxylic dianhydride, an organic group of the following Chemical Formula 8-3 derived from tetrahydro-[3,3'-bifuran]-2,2',5,5'-tetraone, an organic group represented by the following Chemical Formula 8-4 derived from 1,2,4,5-cyclohexanetetracarboxylic dianhydride, an organic group of the following Chemical Formula 8-5 derived from pyromellitic dianhydride, or an organic group of the following Chemical Formula 8-6 derived from 3,3',4,4'-biphenyltetracarboxylic dianhydride.

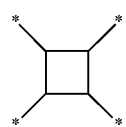

[Chemical Formula 8-1]

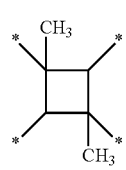

[Chemical Formula 8-2]

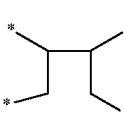

[Chemical Formula 8-3]

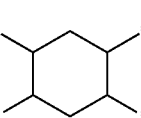

[Chemical Formula 8-4]

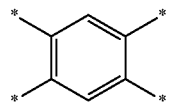

[Chemical Formula 8-5]

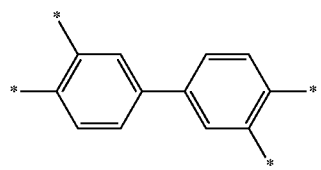

[Chemical Formula 8-6]

Meanwhile, the first polyamic acid (co)polymer in the photosensitive composition according to one embodiment may be a divalent organic group in which $Y_1$ to $Y_3$ in the repeating units of Chemical Formula 6 or Chemical Formulae 12 to 13 are each independently represented by Chemical Formula 9. Since the first polyamic acid (co)polymer is synthesized from a diamine containing an imide repeating unit that is already imidized, anisotropy can be generated by irradiating light immediately without a high temperature heat treatment step after forming the coating film, and then the heat treatment can be performed to complete the alignment film. Therefore, not only can the light irradiation energy be greatly reduced, but also a photosensitive material having excellent alignment and stability as well as excellent voltage retention and electrical properties can be produced by a simple process including a single heat treatment step.

Specifically, in Chemical Formula 9, T may be a functional group represented by the following Chemical Formula 8-1 or a functional group represented by the following Chemical Formula 8-2.

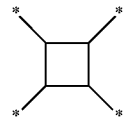

[Chemical Formula 8-1]

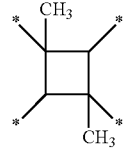

[Chemical Formula 8-2]

More specifically, examples of the organic group represented by Chemical Formula 9 are not particularly limited, but may be, for example, a functional group represented by the following Chemical Formula 9-1 or Chemical Formula 9-2.

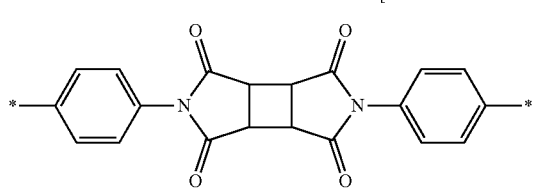

[Chemical Formula 9-1]

-continued

[Chemical Formula 9-2]

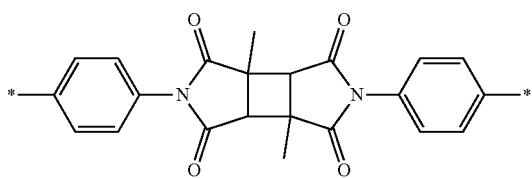

In the first polyamic acid (co)polymer, the repeating unit represented by Chemical Formula 6 may be included at 5 mol % to 74 mol %, or 10 mol % to 60 mol %, based on the total repeating units.

As described above, when a polymer containing a specific content of the imide repeating unit represented by Chemical Formula 6 is used, the first polyamic acid (co)polymer contains a certain amount of imide repeating units that are already imidized, so a photosensitive material having excellent stability can be produced even if the high-temperature heat treatment step is eliminated and light is immediately irradiated.

That is, it is preferable that the repeating unit represented by Chemical Formula 6 is contained in the above-described content range because it can provide a photosensitive polymer having excellent storage stability.

In addition, the repeating unit represented by Chemical Formula 12 or the repeating unit represented by Chemical Formula 13 may be contained in an appropriate amount according to the desired properties.

Meanwhile, the second polyamic acid (co)polymer in the photosensitive composition according to one embodiment may be a divalent organic group in which $Y_4$ to $Y_6$ in the repeating units of Chemical Formula 7 or Chemical Formulae 14 to 15 are each independently represented by Chemical Formula 10. The $Y_4$, $Y_5$, and $Y_6$ are defined as a divalent organic group represented by Chemical Formula 10, and can provide a photosensitive polymer having various structures that can exhibit the above-described effects.

In Chemical Formula 10, A' is a group 15 element, and the group 15 element may be nitrogen (N), phosphorus (P), arsenic (As), tin (Sn), or bismuth (Bi). The R is a functional group bonded to A, and may be bonded to element A' by the number indicated by a. Preferably, in Chemical Formula 10, A' is nitrogen, R is hydrogen, and a may be 1.

Meanwhile, as Chemical Formula 10 satisfies the condition that at least one of $Z_1$ to $Z_4$ is nitrogen and the rest are carbon, the Chemical Formula 10 may form an asymmetric structure that is not symmetrical with respect to the center point or the center line due to the nitrogen atom. The Chemical Formula 10 is a repeating unit derived from a diamine having a specific structure containing a nitrogen atom or the like, which is a precursor used to form the photosensitive polymer, and it is considered to be due to the use of an asymmetric diamine as described below.

The organic group represented by Chemical Formula 10 has a structural feature in which two aromatic cyclic compounds, preferably heteroaromatic cyclic compounds and aromatic cyclic compounds, are bonded via a secondary amine group or a tertiary amine group.

More specifically, in Chemical Formula 10, one of $Z_1$ to $Z_4$ is nitrogen and the rest may be carbon, or alternatively, in Chemical Formula 15, one of $Z_1$ and $Z_3$ may be nitrogen and the other may be carbon, and $Z_2$ and $Z_4$ may be carbon. That is, the aromatic ring containing $Z_1$ to $Z_4$ in Chemical Formula 10 may have a pyridine structure.

In addition, Chemical Formula 10 may include one or more functional groups selected from the group consisting of the following Chemical Formula 10-1, Chemical Formula 10-2, and Chemical Formula 10-3.

[Chemical Formula 10-1]

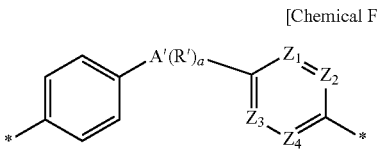

[Chemical Formula 10-2]

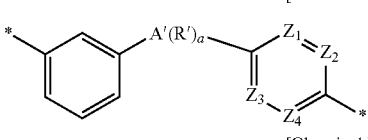

[Chemical Formula 10-3]

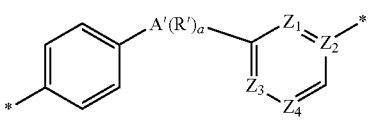

In Chemical Formulae 10-1 to 10-3, the definitions of A', $Z_1$ to $Z_4$, R', and a include those described above in Chemical Formula 10.

More specifically, examples of the organic group represented by Chemical Formula 10 are not particularly limited, but may be, for example, one or more functional groups selected from the group consisting of the following Chemical Formula 10-4, Chemical Formula 10-5, and Chemical Formula 10-6.

[Chemical Formula 10-4]

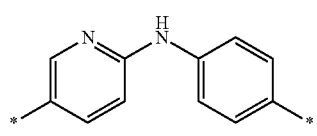

[Chemical Formula 10-5]

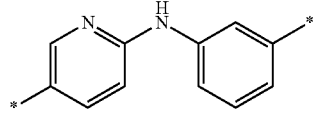

[Chemical Formula 10-6]

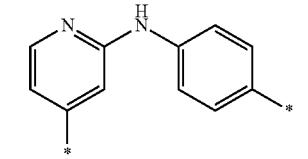

Meanwhile, in the photosensitive composition according to one embodiment, the content of the second polyamic acid (co)polymer may be 10 parts by weight to 1000 parts by weight, or 15 parts by weight to 800 parts by weight, based on 100 parts by weight of the first polyamic acid (co)polymer.

The weight average molecular weight (measured by GPC) of each of the first polyamic acid (co)polymer and the second polyamic acid (co)polymer is not particularly limited, but may be, for example, 10,000 g/mol to 200,000 g/mol.

3. Photosensitive Material

Meanwhile, according to another embodiment of the invention, a photosensitive material including a cured product of the photosensitive composition of the embodiment can be provided. The cured product means a material obtained through a curing process of the photosensitive composition of the embodiment.

When the shape of the photosensitive material is implemented as a film, a layer, or the like, the thickness of the photosensitive material is not particularly limited, but may be freely adjusted within a range of, for example, 0.01 μm to 1000 μm. When the thickness of the photosensitive material increases or decreases by a certain value, the physical properties measured from the photosensitive material may also change by a certain value.

Meanwhile, in the production process of the photosensitive material, the functional groups of $R_1$ and $R_2$ of the crosslinking agent compound represented by Chemical Formula 1 can be detached while being substituted with a hydrogen atom, thereby enabling the crosslinking reaction to proceed.

That is, the photosensitive material may include a combination of a crosslinking agent compound represented by the following Chemical Formula 11 and a polymer containing one or more carboxyl groups.

[Chemical Formula 11]

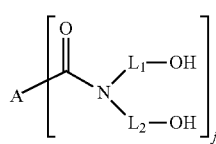

In Chemical Formula 11, A, j, $L_1$, and $L_2$ are as defined in Chemical Formula 1 of one embodiment.

The combination of the crosslinking agent compound represented by Chemical Formula 11 and the polymer containing one or more carboxyl groups can be made by a method in which a hydroxyl group (—OH), which is a crosslinkable functional group contained in the crosslinking agent compound represented by Chemical Formula 11, is combined with a carbonyl group (—CO—) of the carboxy group (—COOH) contained in the polymer containing one or more carboxyl groups to form an ester bond (—COO).

When the crosslinking agent compound represented by Chemical Formula 11 is contained in the photosensitive composition of one embodiment, some crosslinking reactions proceed within the composition, and thereby the crosslinking agent compound is less likely to be dispersed evenly in the composition, and the storage stability is also reduced.

Meanwhile, according to the present invention, the crosslinking agent compound represented by Formula 1 is added to the photosensitive composition to inhibit the crosslinking reaction within the composition, and it can be induced in the production process of the photosensitive material so that the crosslinking agent compound represented by Chemical Formula 1 is spontaneously converted into the crosslinking agent compound represented by Chemical Formula 11. Thereby, the composition can improve the dispersibility and stability of the crosslinking agent compound, and the photosensitive material can realize the effect of improving the mechanical strength through the formation of a crosslinked structure Specifically, examples of the photosensitive material according to the embodiment are not particularly limited, but examples thereof may be a photoresist sheet, an alignment film, an adhesive, an insulating layer, a color filter of a display device, a black matrix of a display device, a column spacer of a display device, photocurable paints, photocurable ink, and the like.

Advantageous Effects

According to the present invention, a crosslinking agent compound having excellent crosslinkability and improved solubility in solvents, a photosensitive composition capable of having improved dispersibility and thus high reliability, and realizing excellent mechanical strength and storage stability during the synthesis of a photosensitive material, and a photosensitive material using the same, can be provided.

Hereinafter, the present invention will be described in more detail by way of examples. However, these examples are for illustrative purposes only and are not intended to limit the scope of the present invention.

PREPARATION EXAMPLE AND COMPARATIVE PREPARATION EXAMPLE

Preparation Example 1: Preparation of Crosslinking Agent

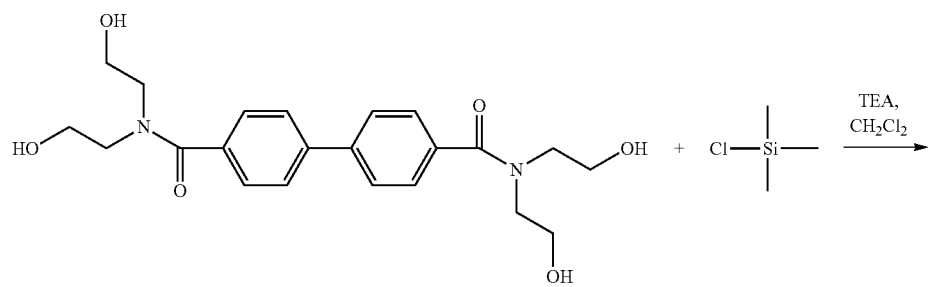

-continued

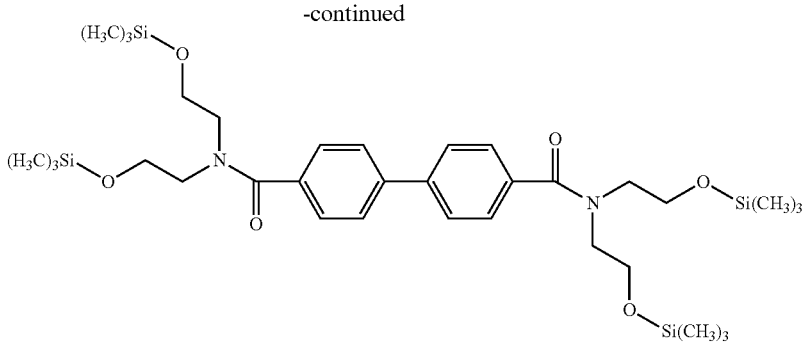

N4,N4,N4',N4'-tetrakis(2-hydroxyethyl)biphenyl-4,4'-dicarboxamide (13.0 g, 31.3 mmol) and triethylamine (19.0 g, 187.8 mmol) were dispersed in dichloromethane (200 mL) under a nitrogen atmosphere, and then the compound trimethylsilyl chloride (13.5 g, 125.2 mmol) was added thereto and stirred at 0° C. for 2 hours and at room temperature for 16 hours. After completion of the reaction, a saturated aqueous sodium hydrogen carbonate solution (300 ml) was added, and the aqueous layer was extracted twice with dichloromethane (200 mL). The extract was treated and dried with magnesium sulfate (10 g) and filtered. The filtrate was concentrated to prepare N4,N4,N4',N4'-tetrakis(2-(trimethylsilyloxy)ethyl)biphenyl-4,4'-dicarboxamide) (17.5 g, yield: 79.3%).

MS[M+H]$^+$=705

Preparation Example 2: Preparation of crosslinking Agent

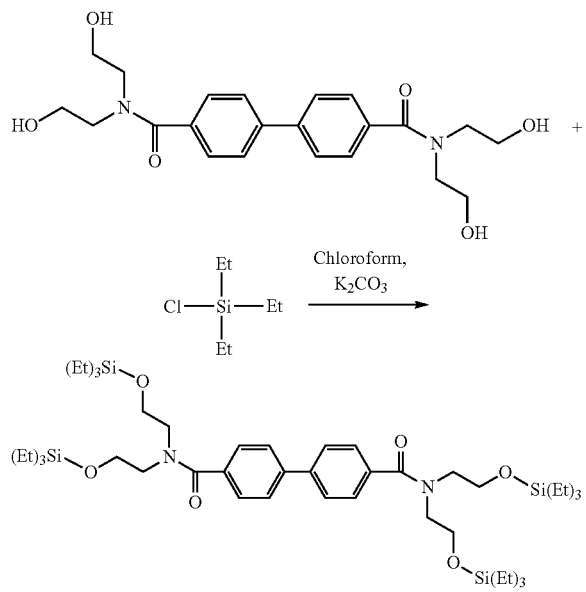

N4,N4,N4',N4'-tetrakis (2-(triethylsilyloxy)ethyl)biphenyl-4,4'-dicarboxamide was prepared in the same manner as in Preparation Example 1, except that chlorotriethylsilane was used instead of chlorotrimethylsilane.

MS[M+H]$^+$=872

Comparative Preparation Example 1: Preparation of Crosslinking Agent

N4,N4,N4',N4'-tetrakis(2-hydroxyethyl)biphenyl-4,4'-dicarboxamide, which is a reaction product of Preparation Example 1, was used as a crosslinking agent of Comparative Preparation Example 1.

Examples: Preparation of Photosensitive Composition and Photosensitive Material

EXAMPLE

Example 1: Preparation of Photosensitive Composition 5.0 g (13.3 mmol) of diamine DA1 represented by Chemical Formula A below was completely dissolved in 71.27 g of anhydrous N-methyl pyrrolidone (NMP). Then, 2.92 g (13.03 mmol) of 1,3-dimethyl-cyclobutane-1,2,3,4-tetracarboxylic dianhydride (DMCBDA) was added to the solution under an ice bath, and then stirred at room temperature for about 16 hours to prepare polymer P-1. The molecular weight of the polymer P-1 was measured by GPC, and as a result, the number average molecular weight (Mn) was 15,500 g/mol and the weight average molecular weight (Mw) was 31,000 g/mol. In addition, the monomer structure of the polymer P-1 was determined by the equivalence ratio of the monomer used, the ratio of the intramolecular imide structure was 50.5%, and the ratio of the amic acid structure was 49.5%.

[Chemical Formula A]

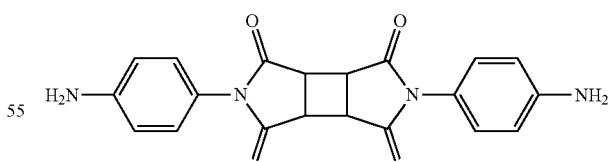

19.743 g (0.099 mol) of diamine DA2 represented by Chemical Formula B below was completely dissolved in 225.213 g of anhydrous N-methyl pyrrolidone (NW). Then, 20.0 g (0.092 mol) of pyromellitic dianhydride (PMDA) was added to the solution under an ice bath, and then stirred at room temperature for about 16 hours to prepare polymer Q-1. The molecular weight of the polymer Q-1 was measured by GPC, and as a result, the weight average molecular weight (Mw) was 27,000 g/mol.

[Chemical Formula B]

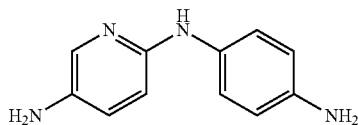

10 g of the polymer P-1 and 10 g of the polymer Q-1 prepared as described above were added to 12.4 g of NMP and 7.6 g of n-butoxyethanol (weight ratio of 8:2) to obtain a 5 wt % solution. Then, as a crosslinking agent, the crosslinking agent obtained in Preparation Example 1 was added to the solution at 5 wt % based on the total solution, and then stirred at 25° C. for 16 hours. The obtained solution was filtered under pressure through a filter made of poly (tetrafluorene ethylene) having a pore size of 0.1 μm to produce a photosensitive composition.

Example 2: Preparation of Photosensitive Composition

A photosensitive composition was prepared in the same manner as in Example 1, except that the crosslinking agent obtained in Preparation Example 1 was added at 10 wt % based on the total solution.

Example 3: Preparation of Photosensitive Composition

A photosensitive composition was prepared in the same manner as in Example 1, except that the crosslinking agent obtained in Preparation Example 2 was added instead of the crosslinking agent obtained in Preparation Example 1.

Example 4: Preparation of Photosensitive Composition

A photosensitive composition was prepared in the same manner as in Example 2, except that the crosslinking agent obtained in Preparation Example 2 instead of the crosslinking agent obtained in Preparation Example 1 was added at 10 wt % based on the total solution.

Comparative Example 1: Preparation of Photosensitive Composition

A photosensitive composition was prepared in the same manner as in Example 1, except that N4,N4,N4',N4'-tetrakis (2-hydroxyethyl)biphenyl-4,4'-dicarboxamide of Comparative Preparation Example 1 was added instead of the crosslinking agent obtained in Preparation Example 1.

The composition of the photosensitive compositions of Examples and Comparative Example above are summarized in Table 1 below.

TABLE 1

| | First polymer | | Second polymer | | Mixing | Crosslinking agent | |
|---|---|---|---|---|---|---|---|
| | Type | Added amount (g) | Type | Added amount (g) | weight ratio of first and second polymers | Type | Added amount (wt %) |
| Example 1 | P-1 | 10 | Q-1 | 10 | 20:80 | Preparative Example 1 | 5 |
| Example 2 | P-1 | 10 | Q-1 | 10 | 20:80 | Preparative Example 1 | 10 |
| Example 3 | P-1 | 10 | Q-1 | 10 | 20:80 | Preparative Example 2 | 5 |
| Example 4 | P-1 | 10 | Q-1 | 10 | 20:80 | Preparative Example 2 | 10 |
| Comparative Example 1 | P-1 | 10 | Q-1 | 10 | 20:80 | Comparative Preparative Example 1 | 5 |

EXPERIMENTAL EXAMPLE

1) Storage Stability

For the photosensitive compositions prepared in the examples and the comparative example, the initial viscosity and the viscosity after storage at room temperature for 30 days were measured, respectively, and the change rate of viscosity was determined by the following Equation 1.

The viscosity of the photosensitive composition was measured according to the torque using a Brookfield viscometer with an RV-7 spindle at a temperature of 25° C. and a rotational speed of 0.5 rpm.

Change rate of viscosity (%)=(Viscosity of photosensitive composition after storage for 30 days at room temperature−Viscosity of original photosensitive composition)/Viscosity of original photosensitive composition*100.  (1)

The smaller the change rate of viscosity calculated by Equation 1, the better the storage stability.

2) Solubility

The crosslinking agents respectively used in the photosensitive compositions of the examples and the comparative example were added to a solvent (γ-butyrolactone) so as to satisfy the addition amount of crosslinking agent shown in Table 1, and then mixed for 10 seconds to prepare a mixed solution. The transparency of the mixed solution was visually confirmed and the solubility level was evaluated under the following criteria.

In the measurement results, if the mixed solution was transparent, it was evaluated as 'excellent', and if the mixed solution was opaque, it was evaluated as 'inferior'. The results are shown in Table 2 below.

TABLE 2

|  | Storage stability (%) | Solubility |
| --- | --- | --- |
| Example 1 | 2.9 | Excellent |
| Example 2 | 1.5 | Excellent |
| Example 3 | 2.3 | Excellent |
| Example 4 | 1.4 | Excellent |
| Comparative Example 1 | more than 8 | Inferior |

As shown in Table 2, as the photosensitive compositions of Examples 1 to 4 use the crosslinking agent compounds having specific structures synthesized in Preparation Examples 1 and 2, the change rate in viscosity of the photosensitive composition has been found to be 2.9% or less, which exhibits excellent storage stability, and simultaneously exhibits excellent solubility.

On the other hand, as the photosensitive composition of Comparative Example 1 uses the crosslinking agent compound of Comparative Preparation Example 1 containing no silicon-containing monovalent functional group, not only is the storage stability very inferior but also the solubility is inferior, as compared with the photosensitive compositions of the examples above.

The invention claimed is:

1. A crosslinking agent compound represented by Chemical Formula 1:

[Chemical Formula 1]

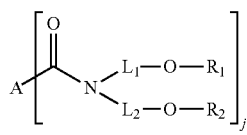

wherein, in the Chemical Formula 1,
A is a monovalent to tetravalent aromatic functional group,
j is an integer of 1 to 4,
$L_1$ and $L_2$ are each independently an alkylene group having 1 to 10 carbon atoms or an arylene group having 6 to 20 carbon atoms, and
$R_1$ and $R_2$ are each independently a silicon-containing monovalent functional group,
wherein the silicon-containing monovalent functional group is a functional group represented by Chemical Formula 3,

[Chemical Formula 3]

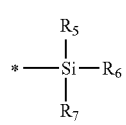

wherein, in the Chemical Formula 3,
$R_5$ to $R_7$ are each independently hydrogen or an alkyl group having 1 to 10 carbon atoms.

2. The crosslinking agent compound according to claim 1, wherein in the Chemical Formula 1,
A is a divalent aromatic functional group represented by Chemical Formula 2, and
j is 2:

[Chemical Formula 2]

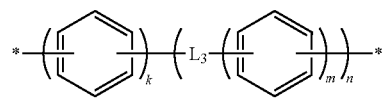

wherein, in the Chemical Formula 2,
$L_3$ is a single bond, —O—, —CO—, —S—, —SO$_2$—, —C(CH$_3$)$_2$—, —C(CF$_3$)$_2$—, —COO—, —(CH$_2$)$_z$—, —O(CH$_2$)$_z$O—, —O(CH$_2$)$_z$—, OCH$_2$—C(CH$_3$)$_2$—CH$_2$O, —COO—(CH$_2$)$_z$—OCO—, or —OCO—(CH$_2$)$_z$—COO—,
each z is independently an integer of 1 to 10,
k is an integer of 1 to 3, and
n and m are each independently an integer of 0 to 3.

3. The crosslinking agent compound according to claim 1, wherein in the Chemical Formula 1,
$L_1$ and $L_2$ are each independently an alkylene group having 1 to 5 carbon atoms.

4. The crosslinking agent compound according to claim 1, wherein the crosslinking agent compound represented by the Chemical Formula 1 includes a compound represented by Chemical Formula 1-1:

[Chemical Formula 1-1]

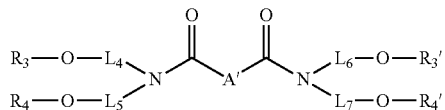

wherein, in the Chemical Formula 1-1,
A' is a divalent aromatic functional group,
$L_4$ to $L_7$ are each independently an alkylene group having 1 to 10 carbon atoms or an arylene group having 6 to 20 carbon atoms, and
$R_3$, $R_3'$, $R_4$, and $R_4'$ are each independently silicon-containing monovalent functional groups,
wherein the silicon-containing monovalent functional group is a functional group represented by Chemical Formula 3,

[Chemical Formula 3]

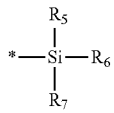

wherein, in the Chemical Formula 3,
$R_5$ to $R_7$ are each independently hydrogen or an alkyl group having 1 to 10 carbon atoms.

5. A photosensitive composition comprising the crosslinking agent compound of claim 1.

6. A photosensitive material comprising a cured product of the positive composition of claim 5.

7. The photosensitive material according to claim 6, wherein the cured product of the photosensitive composition includes a combination of a crosslinking agent compound represented by Chemical Formula 11 and a polymer containing one or more carboxyl groups:

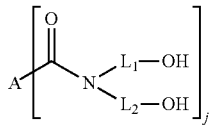

[Chemical Formula 11]

wherein, in the Chemical Formula 11,

A is a monovalent to tetravalent aromatic functional group, j is an integer of 1 to 4, and $L_1$ and $L_2$ are each independently an alkylene group having 1 to 10 carbon atoms or an arylene group having 6 to 20 carbon atoms.

8. A photosensitive composition comprising:

a crosslinking agent compound represented by Chemical Formula 1; and a polymer containing one or more carboxyl groups:

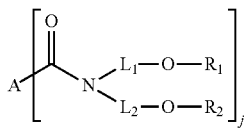

[Chemical Formula 1]

wherein, in the Chemical Formula 1,

A is a monovalent to tetravalent aromatic functional group, j is an integer of 1 to 4, $L_1$ and $L_2$ are each independently an alkylene group having 1 to 10 carbon atoms or an arylene group having 6 to 20 carbon atoms, and $R_1$ and $R_2$ are each independently a silicon-containing monovalent functional group, wherein the silicon-containing monovalent functional group is a functional group represented by Chemical Formula 3,

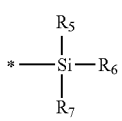

[Chemical Formula 3]

wherein, in the Chemical Formula 3, $R_5$ to $R_7$ are each independently hydrogen or an alkyl group having 1 to 10 carbon atoms.

9. The photosensitive composition according to claim 8, further comprising a compound represented by Chemical Formula 4:

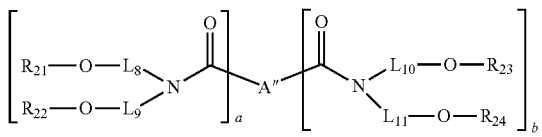

[[Chemical Formula 4]

wherein, in the Chemical Formula 4,

A" is a monovalent to tetravalent functional group, a is an integer of 1 to 4, b is an integer of 0 to 3, a sum of a and b is 1 to 4, $L_8$ to $L_{11}$ are each independently an alkylene group having 1 to 10 carbon atoms or an arylene group having 6 to 20 carbon atoms, at least one of $R_{21}$ and $R_{22}$ is hydrogen and the other is a silicon-containing monovalent functional group, and $R_{23}$ and $R_{24}$ are each independently a silicon-containing monovalent functional group, wherein the silicon-containing monovalent functional group is a functional group represented by Chemical Formula 3,

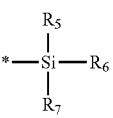

[Chemical Formula 3]

wherein, in the Chemical Formula 3, $R_5$ to $R_7$ are each independently hydrogen or an alkyl group having 1 to 10 carbon atoms.

10. The photosensitive composition according to claim 9, wherein a content of the compound represented by the Chemical Formula 4 is 0.001 parts by weight to 10 parts by weight based on 100 parts by weight of the crosslinking agent compound represented by the Chemical Formula 1.

11. The photosensitive composition according to claim 10, further comprising a compound represented by Chemical Formula 5:

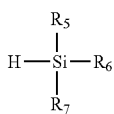

[Chemical Formula 5]

wherein, in the Chemical Formula 5, $R_5$ to $R_7$ are each independently hydrogen or an alkyl group having 1 to 10 carbon atoms.

12. The photosensitive composition according to claim 8, wherein the polymer containing one or more carboxyl groups includes a first polyamic acid (co)polymer containing a repeating unit represented by Chemical Formula 6, and a second polyamic acid (co)polymer containing a repeating unit represented by Chemical Formula 7:

[Chemical Formula 6]

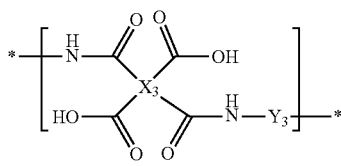

[Chemical Formula 7]

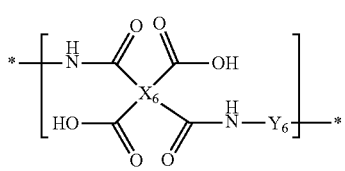

wherein, in the Chemical Formulae 6 and 7, $X_3$ and $X_6$ are each independently a tetravalent organic group represented by Chemical Formula 8:

[Chemical Formula 8]

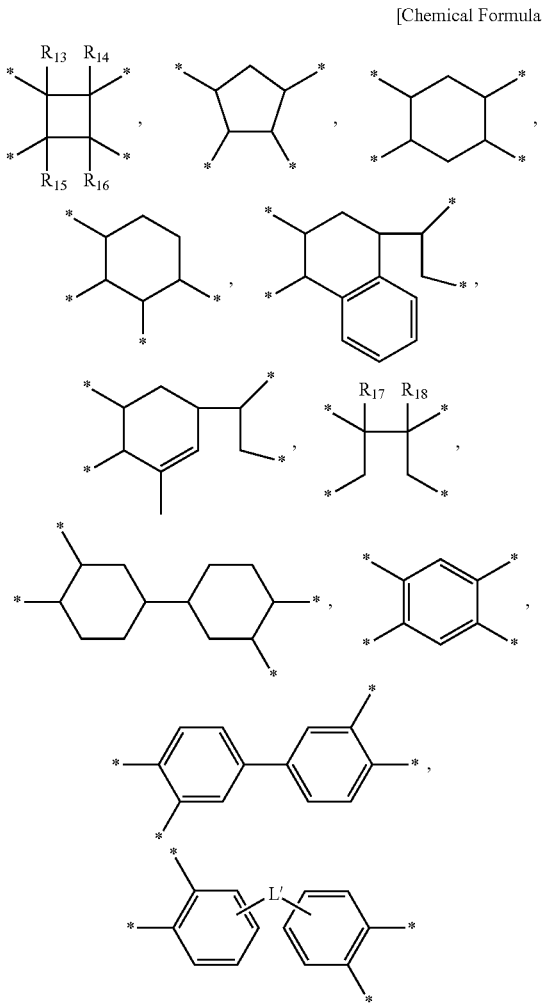

wherein, in the Chemical Formula 8,
$R_{13}$ to $R_{14}$ are each independently hydrogen or an alkyl group having 1 to 6 carbon atoms,
L' is any one selected from a single bond, —O—, —CO—, —COO—, —S—, —SO—, —SO$_2$—, —CR$_{19}$R$_{20}$—, —(CH$_2$)$_z$—, —O(CH$_2$)$_z$O—, —COO(CH$_2$)$_z$OCO—, —CONH—, and phenylene, $R_{19}$ and $R_{20}$ are each independently hydrogen, an alkyl group having 1 to 10 carbon atoms, or a haloalkyl group having 1 to 10 carbon atoms,
z is an integer of 1 to 10, and
$Y_3$ is a divalent organic group represented by Chemical Formula 9:

[Chemical Formula 9]

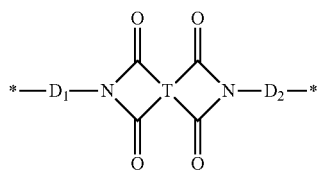

wherein, in the Chemical Formula 9,
T is a tetravalent organic group represented by the Chemical Formula 8,
$D_1$ and $D_2$ are each independently any one selected from an alkylene group having 1 to 20 carbon atoms, a hetero-alkylene group having 1 to 10 carbon atoms, a cycloalkylene group having 3 to 20 carbon atoms, an arylene group having 6 to 20 carbon atoms, and a heteroarylene group having 2 to 20 carbon atoms, and
$Y_6$ is a divalent organic group represented by Chemical Formula 10:

[Chemical Formula 10]

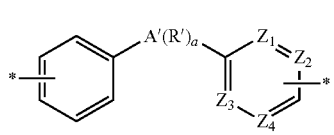

wherein, in the Chemical Formula 10,
A' is a group 15 element selected from the group of nitrogen (N), phosphorus (P), arsenic (As), tin (Sn), and bismuth (Bi),
R' is hydrogen or an alkyl having 1 to 10 carbon atoms,
a is an integer of 1 to 3, and
at least one of $Z_1$ to $Z_4$ is nitrogen and the rest are carbon.

13. The photosensitive composition according to claim 12, wherein the first polyamic acid (co)polymer further includes one or more repeating units selected from the group consisting of a repeating unit represented by Chemical Formula 12 and a repeating unit represented by Chemical Formula 13:

[Chemical Formula 12]

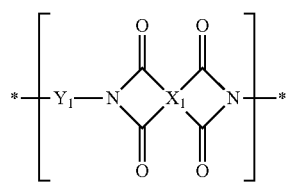

[Chemical Formula 13]

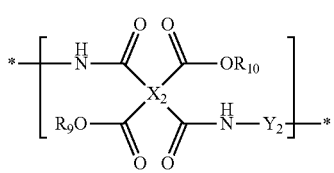

wherein, in the Chemical Formulae 12 and 13 at least one of $R_9$ and $R_{10}$ is an alkyl group having 1 to 10 carbon atoms and the other is hydrogen, $X_1$ to $X_2$ are each independently a tetravalent organic group represented by the Chemical Formula 8, and $Y_1$ to $Y_2$ are each independently a divalent organic group represented by the Chemical Formula 9.

14. The photosensitive composition according to claim 12, wherein the second polyamic acid (co)polymer further includes one or more repeating units selected from the group consisting of a repeating unit represented by Chemical Formula 14 and a repeating unit represented by Chemical Formula 15:

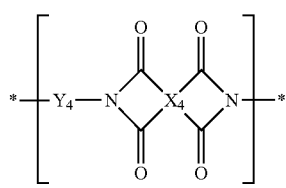

[Chemical Formula 14]

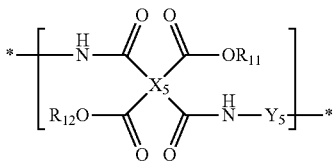

[Chemical Formula 15]

wherein, in the Chemical Formulae 14 and 15, at least one of $R_{11}$ and $R_{12}$ is an alkyl group having 1 to 10 carbon atoms and the other is hydrogen, $X_4$ to $X_5$ are each independently a tetravalent organic group represented by the Chemical Formula 8, and $Y_4$ to $Y_5$ are each independently a divalent organic group represented by the Chemical Formula 10.

15. A photosensitive material comprising a cured product of the photosensitive composition of claim 8.

* * * * *